United States Patent
Tsuzaki et al.

[11] Patent Number: 5,986,367
[45] Date of Patent: Nov. 16, 1999

[54] MOTOR MOUNTING MECHANISM FOR A CYLINDRICAL VIBRATION MOTOR

[75] Inventors: Toshiaki Tsuzaki; Koji Kuyama; Eiichi Ibata, all of Yonago; Kodo Fukuoka, Saihaku-gun; Hideki Shimada, Moriguchi, all of Japan

[73] Assignee: Matsushita Electric Industrial Co., Ltd., Osaka, Japan

[21] Appl. No.: 08/827,221

[22] Filed: Mar. 28, 1997

[30] Foreign Application Priority Data

Mar. 29, 1996 [JP] Japan ................................ 8-076130

[51] Int. Cl.⁶ ...................... H02K 7/065; H02K 7/075
[52] U.S. Cl. ................ 310/71; 310/40 MM; 310/81; 310/DIG. 6; 340/407.1; 340/825.46
[58] Field of Search .................. 310/40 MM, 81, 310/71, DIG. 6; 340/825.46, 407; 29/845; 428/DIG. 901; 439/890

[56] References Cited

U.S. PATENT DOCUMENTS

| | | | |
|---|---|---|---|
| 3,446,692 | 5/1969 | Kato | 310/71 |
| 4,786,889 | 11/1988 | Hayasaka | 340/311.1 |
| 5,015,519 | 5/1991 | Yumoto | 428/209 |
| 5,023,504 | 6/1991 | Mooney et al. | 310/322 |
| 5,107,155 | 4/1992 | Yamaguchi | 310/81 |
| 5,112,234 | 5/1992 | Johnson et al. | 439/79 |
| 5,395,263 | 3/1995 | Sandell | 439/500 |
| 5,427,537 | 6/1995 | Savovic et al. | 439/77 |
| 5,586,907 | 12/1996 | Frantz et al. | 439/500 |
| 5,603,158 | 2/1997 | Murata et al. | 29/846 |
| 5,749,737 | 5/1998 | Zuin | 439/500 |

FOREIGN PATENT DOCUMENTS

| | | | |
|---|---|---|---|
| 5-64391 | 3/1993 | Japan | 310/81 |
| 8-9586 | 1/1996 | Japan | 310/81 |

Primary Examiner—Nestor Ramirez
Assistant Examiner—Karl Imayoshi E. Tamai
Attorney, Agent, or Firm—Wenderoth, Lind & Ponack, L.L.P.

[57] ABSTRACT

In a motor mounting mechanism, a cylindrical motor includes a frame (6) serving as a stator and an electric power supply terminal (2) attached to a bottom surface of a bracket (1). When the motor is mounted to a motor attachment device, a first external electrode (10) is mechanically and electrically connected to a cylindrical side surface of the frame (6) while a second external electrode (11) is mechanically and electrically connected to the power supply terminal (2). The first and second external electrodes are both located outside the motor, and thus, the process of providing lead wires for connecting the external electrodes to the printed board can be omitted, allowing the total size of the motor mounting mechanism to be reduced.

4 Claims, 10 Drawing Sheets

MOTOR MOUNTING MECHANISM FOR A CYLINDRICAL VIBRATION MOTOR

BACKGROUND OF THE INVENTION

1. Field of the Invention

The present invention relates to a motor mounting mechanism, in particular relates to a combination of a motor attachment device and a vibration generating type cylindrical motor to be mounted thereto, for use in a vibration alarm device of a portable telephone and the like equipment.

2. Description of the Prior Art

Figure 16:
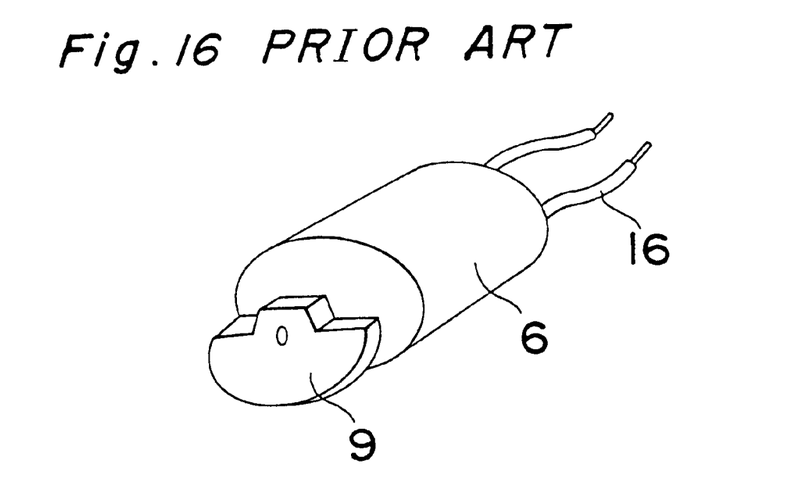
FIG. 16 is a schematic perspective view of a conventional cylindrical vibration motor.

In a conventional calling or alarming device of a vibration generating type, there has been mainly used a miniature cylindrical coreless-type vibration motor as shown in FIG. 16. In such a conventional device, the cylindrical motor is comprised of a frame portion 6 and a weight 9 of a high density metal which is eccentrically attached to a rotation shaft of the motor for generating vibrations. The motor is further provided with lead wires 16 through which electric power is supplied from a power source to drive the motor.

However, in this conventional device, there has been a problem such that, since a space for mounting the motor is limited to be small, therefore there has been an increased demand or requirement for simplifying a motor mounting mechanism with reduction of a space for mounting the motor to a motor attachment device.

SUMMARY OF THE INVENTION

Accordingly, an essential objective of the present invention is to provide a motor mounting mechanism for mounting a cylindrical motor of a vibration generating type to a motor attachment device with reduction of a space for mounting the motor, thus eliminating the problem involved in the conventional device.

In order to attain the objective, the present invention provides a motor mounting mechanism which is a combination of a motor attachment device and a vibration generating type cylindrical motor to be securely mounted thereto. The cylindrical motor comprises:

- a frame serving as a stator having a generally cylindrical shaped side surface;
- a rotator included within the frame;
- a weight for generating vibrations eccentrically attached to a rotating shaft of the motor;
- a bracket of an electrically insulative material which is provided at a bottom opening portion of the frame;
- a first and second brush members provided within said frame for supplying electric power to the rotator;
- an electric power supply terminal attached to a bottom surface of said bracket, wherein one of the brush members is electrically connected to the frame and the other of the brush members is electrically connected to the electric power supply terminal.

The motor attachment device comprises:

- a first external electrode which is mechanically and electrically connected to the cylindrical side surface of the frame when the motor is mounted; and
- a second external electrode which is mechanically and electrically connected to the power supply terminal, wherein said first and second external electrodes are both located outside the motor.

By this arrangement, after the cylindrical motor is mounted to the motor attachment device, the process of providing lead wires for connecting the external electrodes to the printed board can be omitted, and accordingly it is not required to provide a space for such lead wires, allowing the total size of the motor mounting mechanism to be reduced.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS

Before the description proceeds, it is noted here that, since the basic structures of the present embodiments are similar in common, like parts are designated by the same reference numerals throughout the accompanying drawings.

First Embodiment

The following describes, with reference to FIGS. 1 through 9, a first embodiment of a motor mounting mechanism according to the present invention in which a cylindrical motor of a vibration generating type is secured to a motor attachment device.

Figure 1:
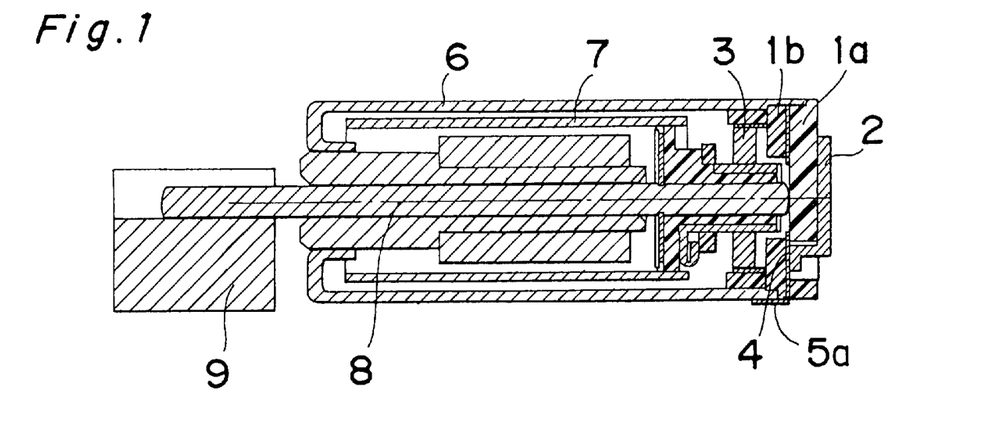
FIG. 1 is a longitudinal side view in section of a cylindrical vibration motor according to a first embodiment of the present invention.
Figure 2:
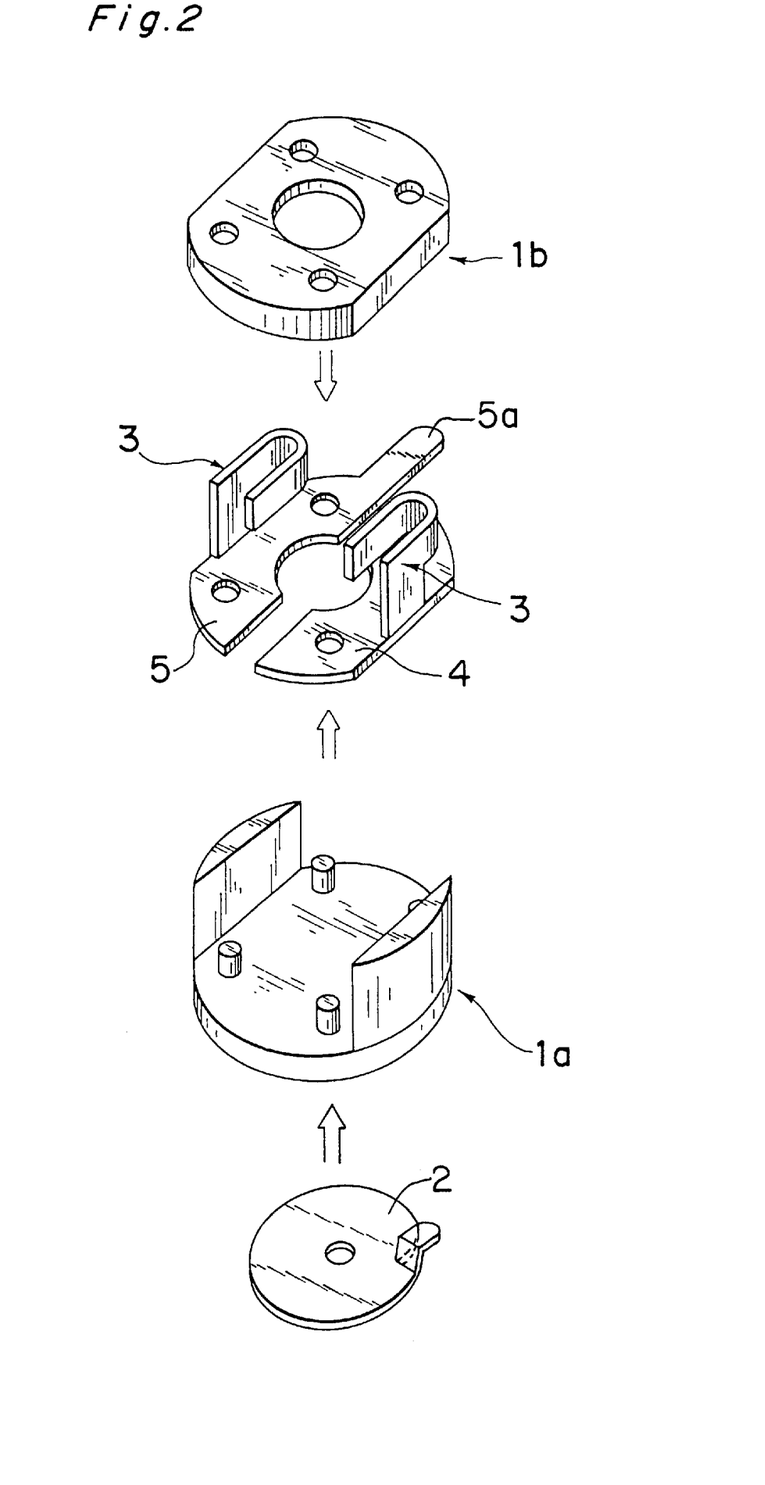
FIG. 2 is an exploded schematic view of a bottom portion of the motor shown in FIG. 1.

Referring to FIGS. 1 and 2, a cylindrical motor of a vibration generating type has a generally cylindrical shaped frame 6 serving as a stator which forms an outermost side and top wall portions of the motor, and a bracket 1 serving as a bottom part of the motor. The bracket 1 is comprised of first and second bracket portions 1a and 1b which are made of e.g. polyamide or the like electrically insulative resin material. The motor includes first and second terminal plates 4 and 5 which are secured between the first and second bracket portions 1a and 1b when combined. The motor further includes first and second brush members 3 made of a silver group alloy within the frame 6, and the brush members 3 protrude from the first and second terminal plates 4 and 5, respectively. The frame 6 is formed by press-molding of a metal plate, and a side wall of the frame 6 is electrically connected to an integral projection 5a of the second terminal plate 5 by spot welding.

On an outer bottom surface of the first bracket portion 1a, attached is a white metal plate serving as an electric power supply terminal 2 having an outer surface thereof plated with gold while the power supply terminal 2 is electrically connected to the first terminal plate 4 by spot welding. As indicated above, second terminal plate 5 is electrically connected to a side plane of the frame 6 by spot welding.

The cylindrical motor further includes a rotator 7 having a coil wire formed by molding, a rotating shaft 8, and a weight 9 engaged with the rotating shaft 8 for generating vibrations. The weight 9 is formed by molding a high density metal such as tungsten or the like metal and is eccentrically attached to the shaft 8 by means of e.g. caulking or the like means.

By this arrangement, there can be provided an electric power supply portion on the outer surface of the motor without increasing the total length of the motor. Thus, when the frame 6 and the power supply terminal 2 are supplied with electric power, the supplied electric power is fed to the rotator 7 via the brush member 3, and accordingly, the weight 9 is eccentrically rotated with rotation of the rotating shaft 8, thereby generating a vibration alarm as desired.

Figure 3:
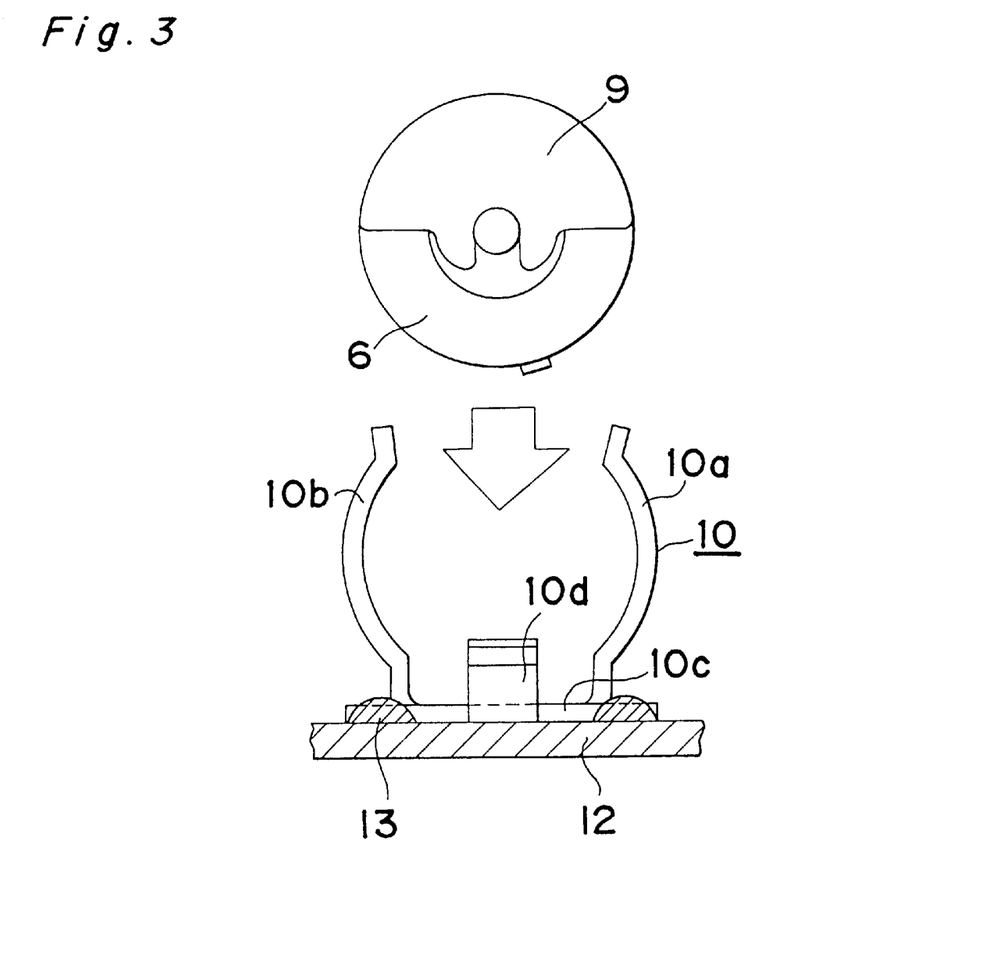
FIG. 3 is a front view of a motor attachment mechanism of the first embodiment in a state before the cylindrical vibration motor is mounted to a motor attachment device.
Figure 4:
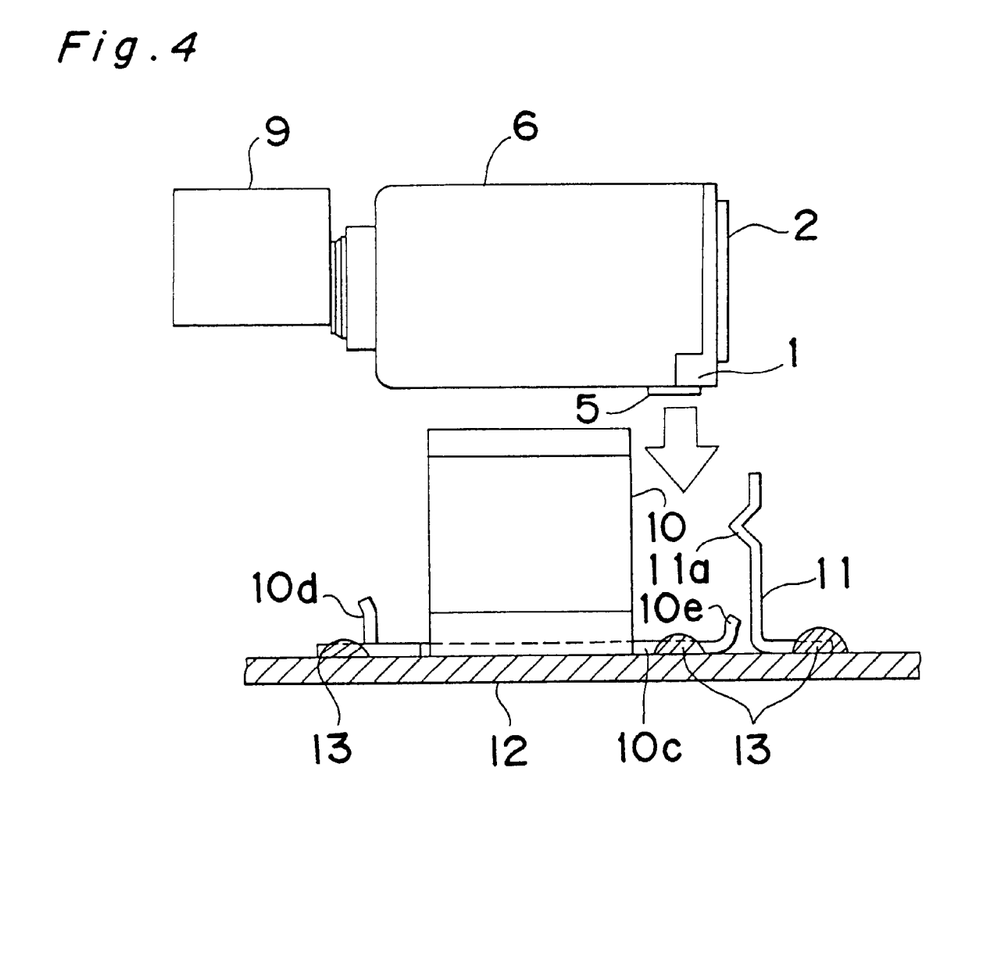
FIG. 4 is a side view of a motor attachment mechanism of the first embodiment in a state before the cylindrical vibration motor is mounted to a motor attachment device.
Figure 5:
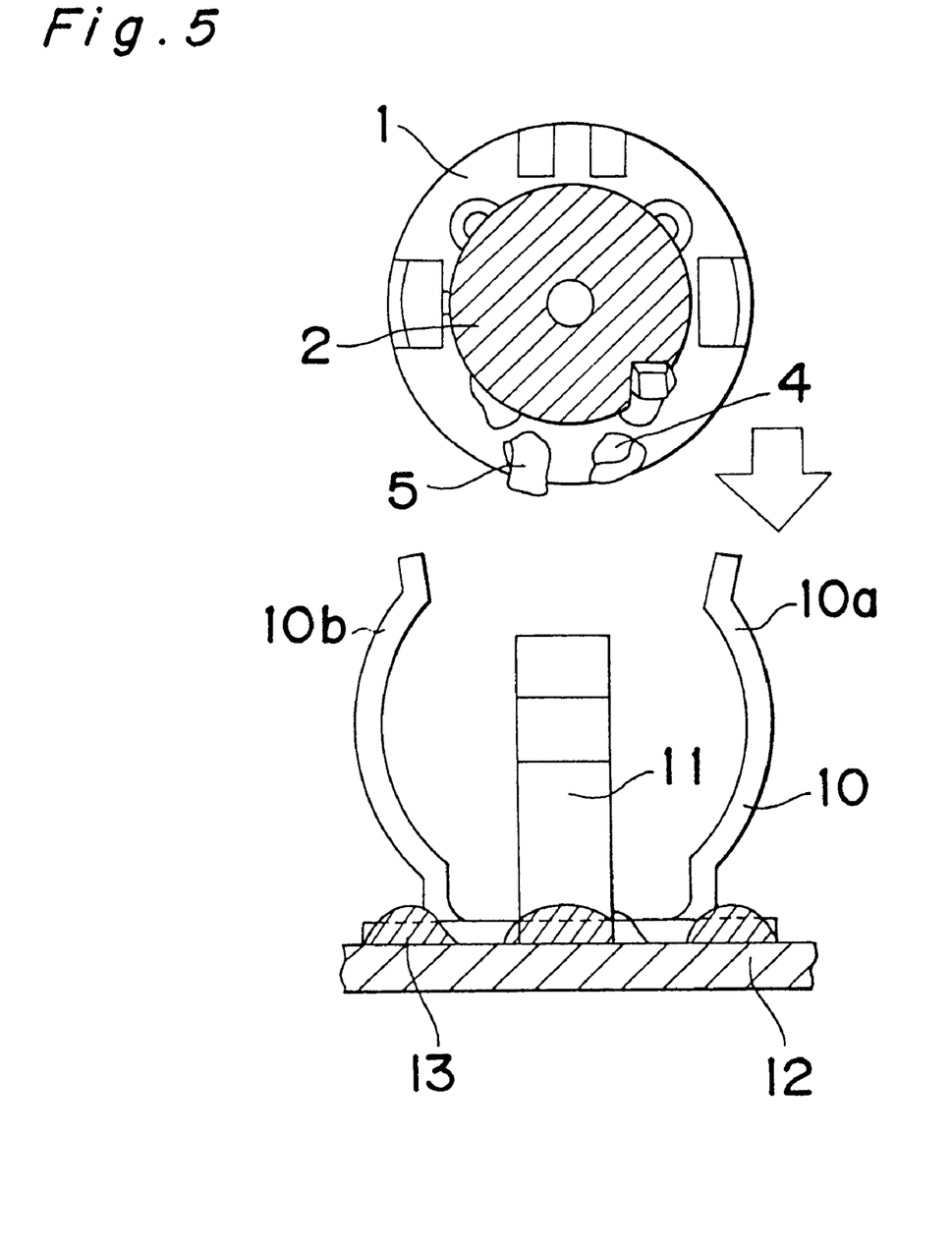
FIG. 5 is a back plan view of a motor attachment mechanism of the first embodiment in a state before the cylindrical vibration motor is mounted to a motor attachment device.

FIGS. 3 to 5 show a motor mounting mechanism of the first embodiment in a state before the cylindrical vibration motor is mounted to the motor attachment device.

As shown in FIG. 3, the motor attachment device is comprised of a motor securing member 10 which is fixed onto a printed board 12. The motor securing member 10 is of an elastic stainless material having a surface plated with solder while the printed board 12 is coated with a copper foil on its surface. The motor securing member 10 is comprised of a pair of curved free end wall portions 10a and 10b vertically rising from the printed board 12 for securely fitting with a cylindrical motor, and a bottom planar portion 10c for securely receiving the cylindrical motor thereon, and first and second rising edges 10d and 10e vertically folded and rising from the bottom planar portion 10c. The bottom planar portion 10c of the motor securing member 10 is mechanically and electrically connected onto the printed board 12 by soldering at 13.

Figure 6:
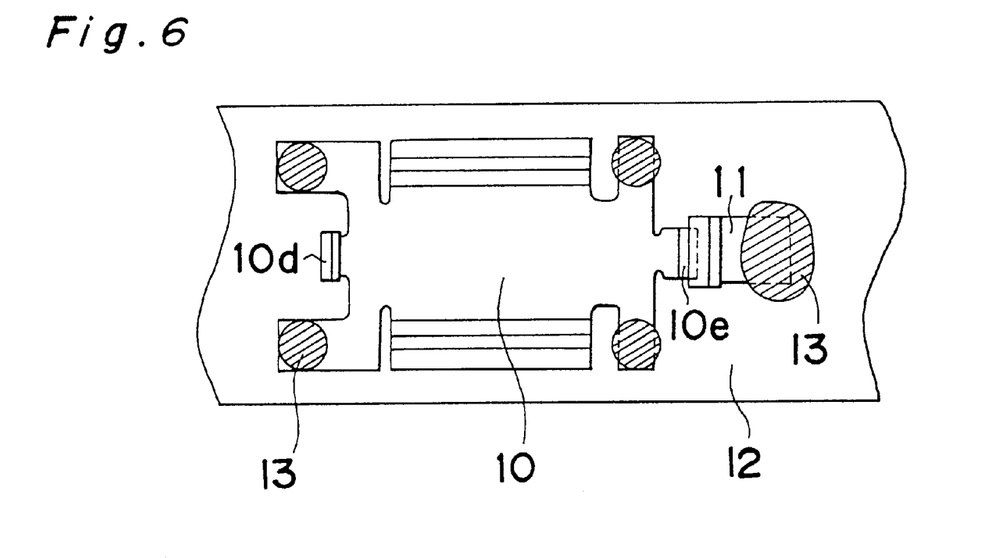
FIG. 6 is a top plan view of a motor attachment device of the first embodiment.

As shown in FIGS. 4 through 6, an elastic electrode plate 11 of e.g. phosphor bronze having a blade spring characteristic is vertically provided on the printed board 12. The elastic electrode plate 11 has a surface which is plated with gold and a base portion which is mechanically and electrically connected to the copper foil coated on the printed board 12 by soldering at 13. The vertically rising portion of the elastic electrode plate 11 has a V-shaped portion 11a for contacting with the power supply terminal 2 of the cylindrical motor when the motor is mounted to the motor attachment device.

The second terminal plate 5 extending from the first bracket portion 1a is electrically connected to the frame 6 while the first terminal plate 4 is electrically connected to the power supply terminal 2 attached to the bottom surface of the first bracket portion 1a.

Figure 7:
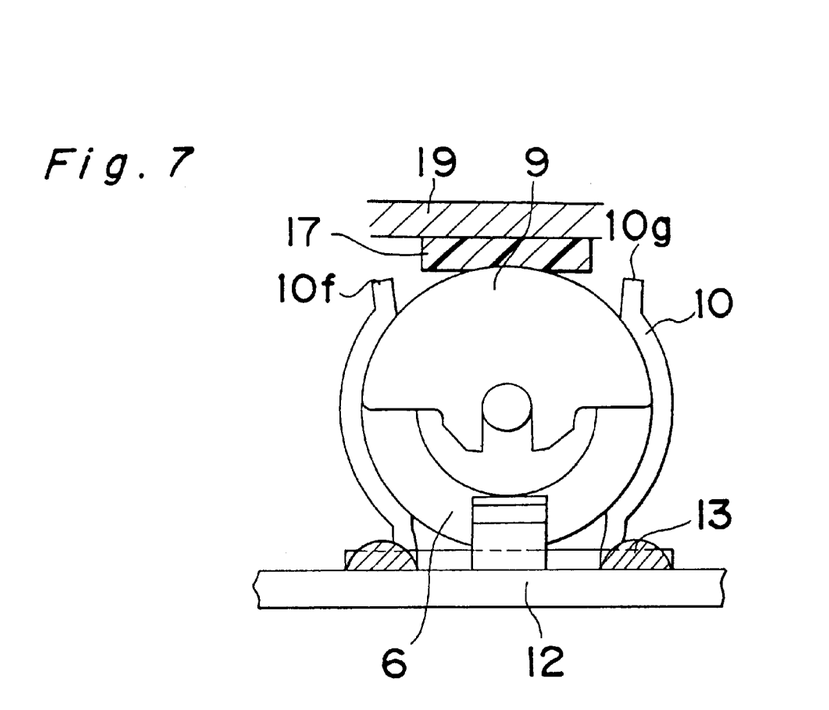
FIG. 7 is a front view of a motor attachment mechanism of the first embodiment in a state after the cylindrical vibration motor is mounted to a motor attachment device.
Figure 8:
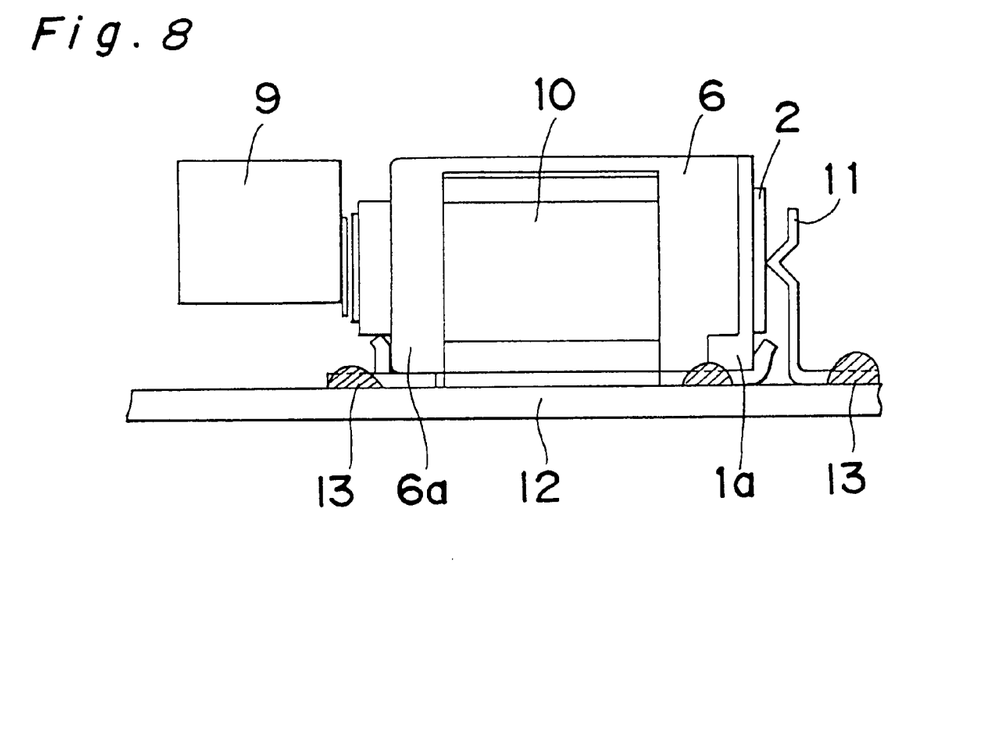
FIG. 8 is a side view of a motor attachment mechanism of the first embodiment in a state after the cylindrical vibration motor is mounted to a motor attachment device.
Figure 9:
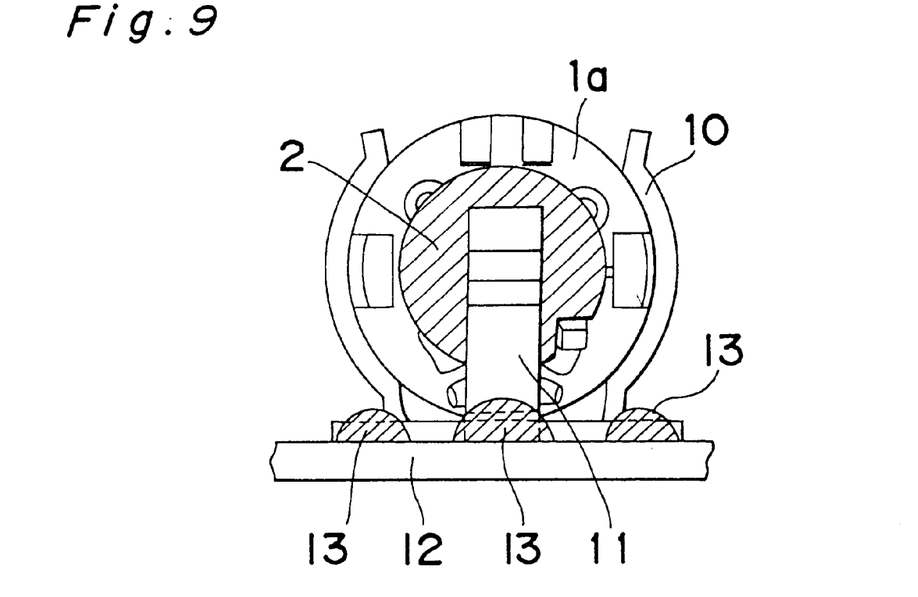
FIG. 9 is a back plan view of a motor attachment mechanism of the first embodiment in a state after the cylindrical vibration motor is mounted to a motor attachment device.

FIGS. 7 to 9 show a motor mounting mechanism of the first embodiment in a state after the cylindrical vibration motor is mounted to the motor attachment device.

In this state, the frame 6 of the motor is secured by the motor securing member 10 due to the urging force thereof, and therefore the frame 6 is electrically connected to the printed board 12 via the motor securing member 10. The power supply terminal 2, attached to the first bracket portion 1a, is urgingly abutted by the elastic electrode plate 11, and therefore the power supply terminal 2 is electrically connected to the printed board 12 via the elastic electrode plate 11.

Also, in this mounted state of the motor, the wall portion 6a of the frame 6 and a lower end portion of the first bracket portion 1a are depressingly abutted to the first and second rising edges 10d and 10e vertically folded from the bottom plane portion 10c of the motor securing member 10, respectively, due to the urging force thereof applied to the cylindrical motor in the axial direction, thereby preventing removal of the motor in the longitudinal direction from the motor attachment device.

In order to prevent the removal of the motor from the motor securing member 10 in a vertical direction (upward direction in the drawing), a rubber-like elastic member 17 may be provided under a set body portion 19 for urging the frame 6 downward as shown in FIG. 7.

Second Embodiment

Figure 10:
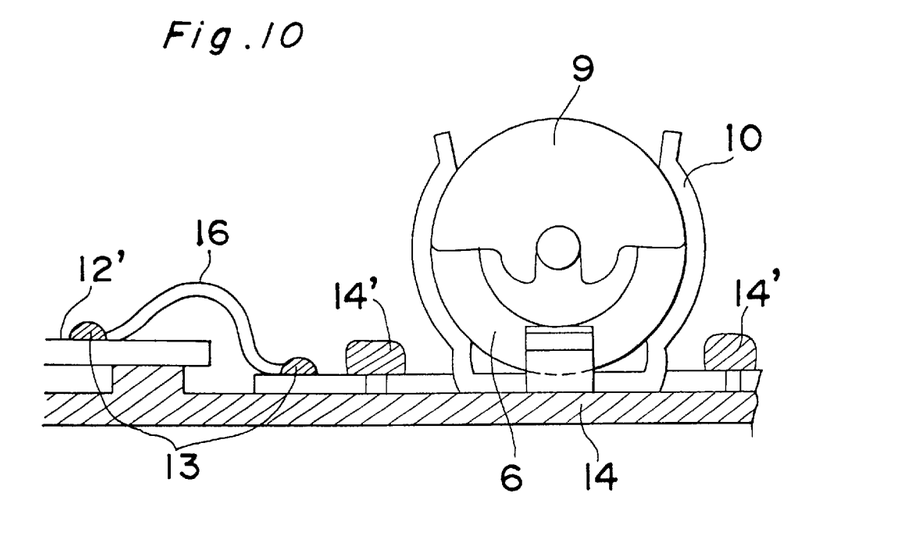
FIG. 10 is a front view of a motor attachment mechanism of a second embodiment in a state after the cylindrical vibration motor is mounted to a motor attachment device.
Figure 11:
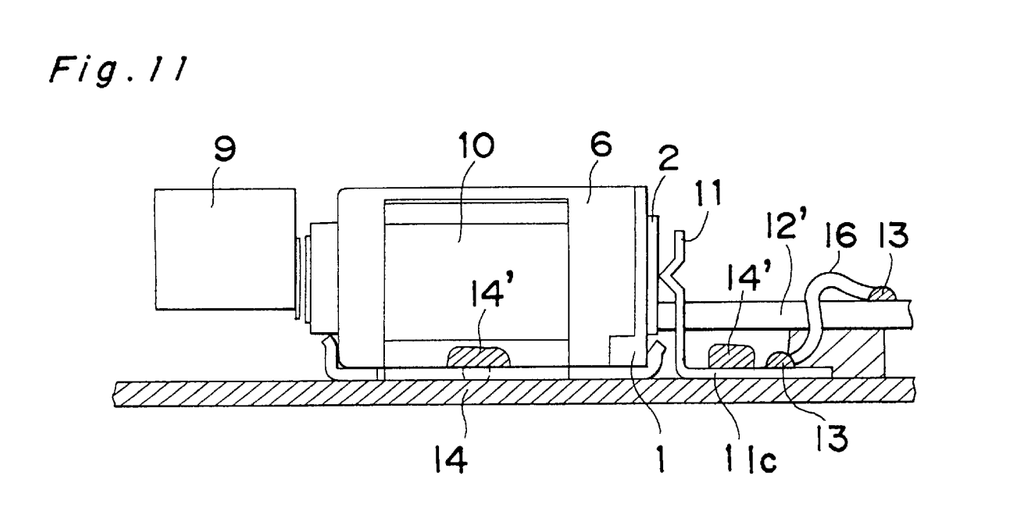
FIG. 11 is a side view of a motor attachment mechanism of the second embodiment in a state after the cylindrical vibration motor is mounted to a motor attachment device.
Figure 12:
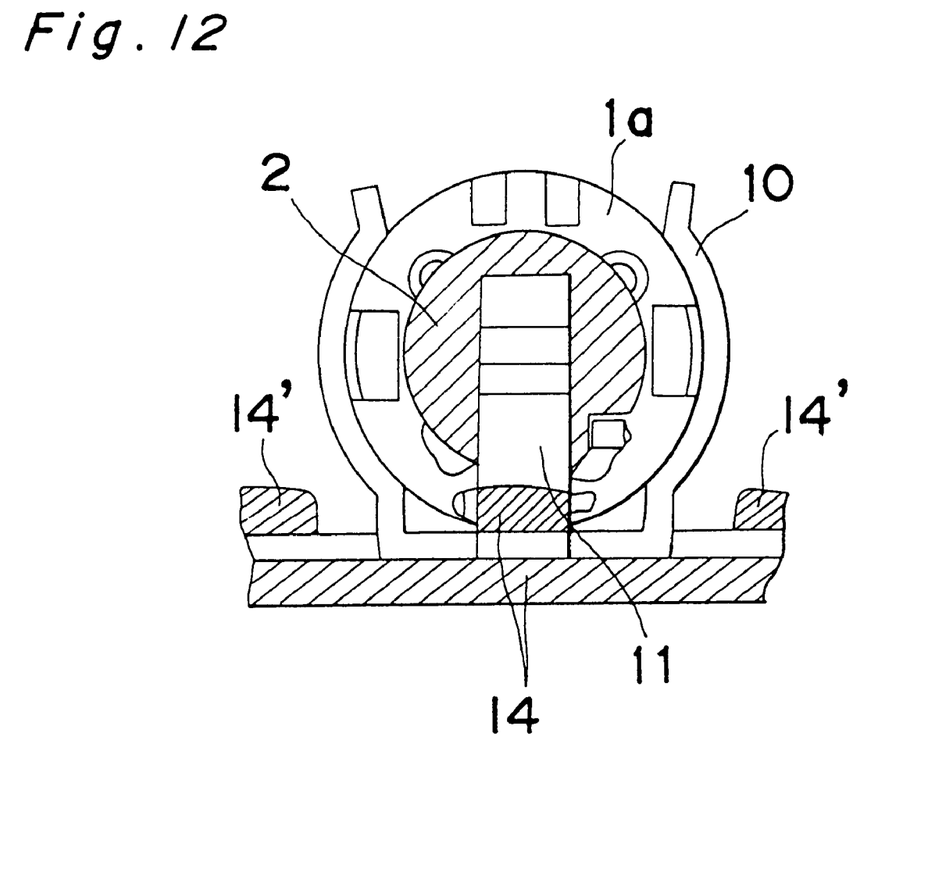
FIG. 12 is a back plan view of a motor attachment mechanism of the second embodiment in a state after the cylindrical vibration motor is mounted to a motor attachment device.

The following describes a second embodiment of a motor mounting mechanism according to the present invention with reference to FIGS. 10 through 12.

In this embodiment, the difference from the first embodiment resides in the fact that, instead of fixing the motor securing member 10 onto the printed board 12, a resin board 14, formed by molding with polycarbonate or the like resin material, is used and the motor securing member 10 is fixed onto the resin board 14 by way of ultrasonic melting and freezing fusion of the same resin material 14' welled out on the bottom plane portion 10c of the motor securing member 10. The motor securing member 10 is electrically connected to the printed board 12' via a lead wire 16. Therefore, when the motor is mounted to the motor attachment device, the frame 6 of the motor is secured between the motor securing member 10 due to the urging force thereof. Accordingly, the frame 6 is electrically connected to the printed board 12' via the motor securing member 10.

Similarly, the elastic electrode plate 11 of e.g. phosphor bronze is vertically provided on the resin board 14, where the base portion 11c of the elastic electrode plate 11 is fixed onto the resin board 14 by way of ultrasonic melting and freezing fusion of the same resin material 14' welled out on the base portion of the elastic electrode plate 11. Since the elastic electrode plate 11 is electrically connected to the printed board 12' via a lead wire 16, when the motor is mounted to the motor attachment device, the power supply terminal 2 attached to the bracket 1 of the motor is urgingly abutted into contact with the elastic electrode plate 11. Thus, the power supply terminal 2 of the motor is electrically connected to the printed board 12' via the elastic electrode plate 11 and the lead wire 16.

Third Embodiment

Figure 13:
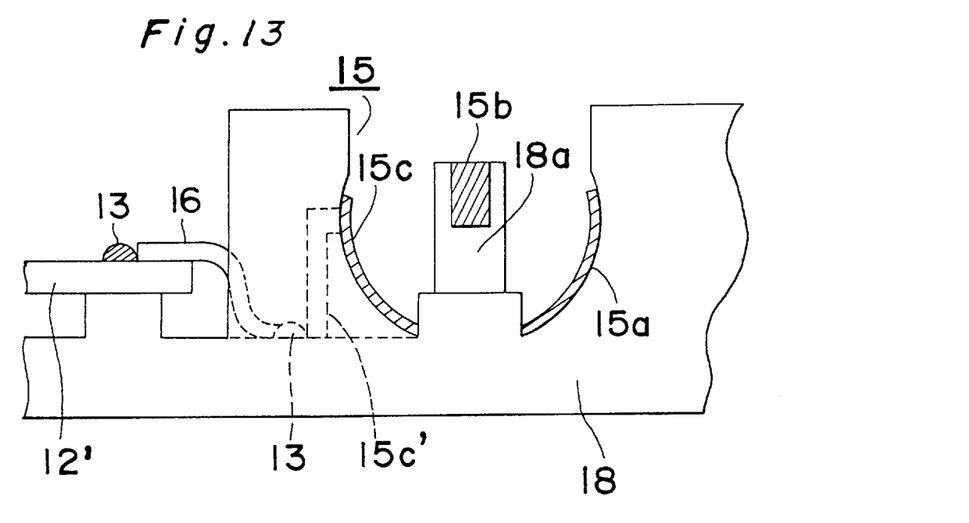
FIG. 13 is a front view of a motor attachment device of a third embodiment.
Figure 14:
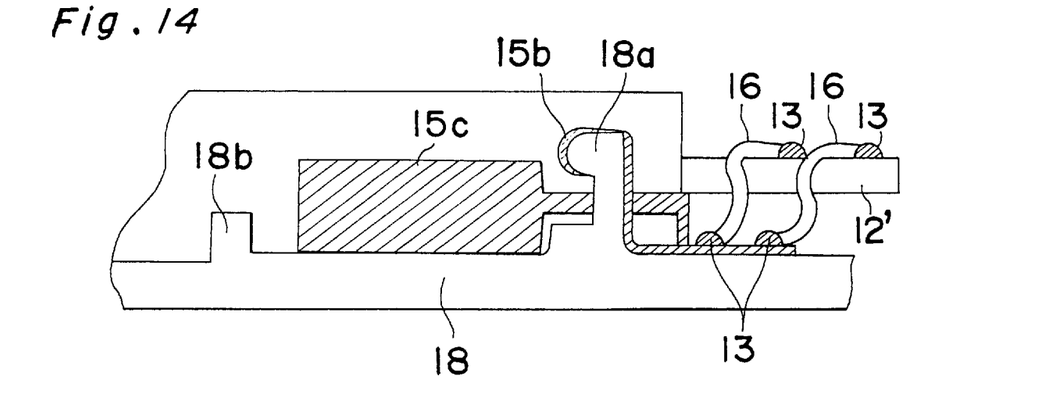
FIG. 14 is a side sectional view of a motor attachment device of the third embodiment.
Figure 15:
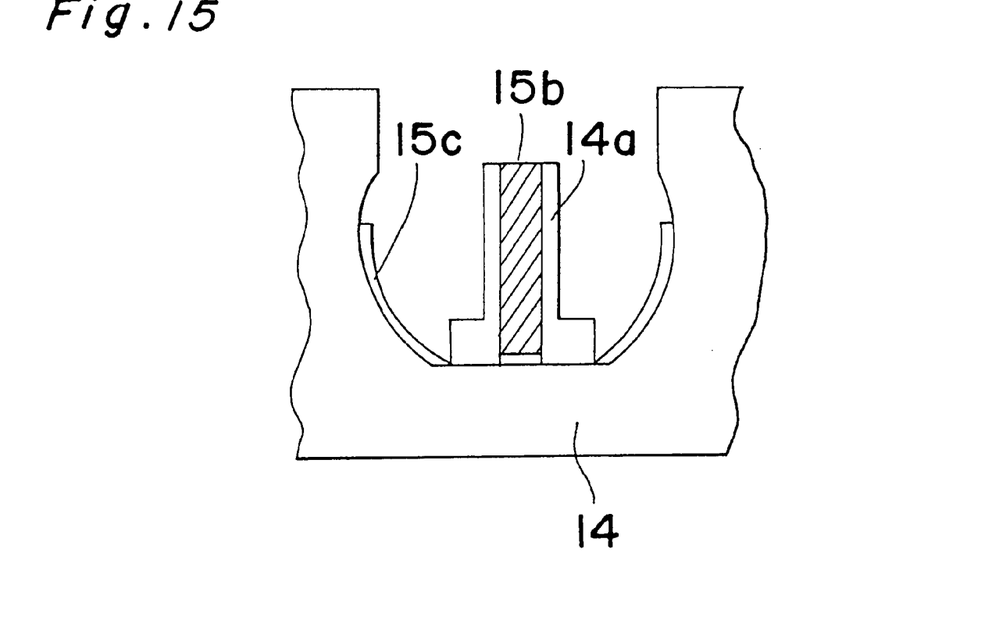
FIG. 15 is a back plan view of a motor attachment device of the third embodiment.

The following describes a third embodiment of a motor mounting mechanism according to the present invention with reference to FIGS. 13 through 15.

In this embodiment, the difference from the second embodiment resides in the fact that, instead of providing the motor securing member 10 fixed onto the resin board 14, the motor attachment device is comprised of a thick resin board 18 of polycarbonate or the like resin material which is formed by molding with an engraved concave portion 15 for receiving a cylindrical motor. The concave portion 15 has a curved side wall 15a having a surface coated with a copper foil 15c which is electrically connected to the printed board 12' via a lead wire 16 and via an electrically conductive portion 15c' coated with a copper foil the like material. Since the resin board 18 has an elastic property, therefore when the motor is mounted to the motor attachment device, the frame 6 of the motor is secured by the curved side wall 15a of the concave portion 15 and is urgingly abutted into engagement with the copper foil 15c coated thereon. Thus, the frame 6 of the motor is electrically connected to the printed board 12' via the copper foil 15c of the concave portion 15.

The resin board 18 has first and second vertically extruded portions 18a and 18b integrally formed with the resin board 18 for urgingly securing the motor in the longitudinal direction. The first extruded portion 18a has a free end with an inward projection having its surface coated with a copper foil 15b which is electrically connected to the printed board 12' via a lead wire 16. Thus, when the motor is mounted to the motor attachment device, the power supply terminal 2 of the motor urgingly abuts the copper foil 15b coated on the free end projection of the first extruded portion 18a due to the elastic property thereof. By this arrangement, when the motor is mounted, the power supply terminal 2 is electrically connected to the printed board 12' via the copper foil 15b of the first extruded portion 18a.

It is noted here that, although the surface of the power supply terminal 2 is plated with gold for improving the electrical conductivity, the surfaces of other parts such as frame portion 6, motor securing member 10, elastic electrode plate 11 and copper foils 15b and 15c may be similarly plated with high conductive material such as gold for improving the electrical conductivity.

As described above, according to the present invention, after the cylindrical motor is mounted to the motor attachment device, the process of providing lead wires for connecting the external electrodes to the printed board can be omitted, and therefore it is not required to provide a space for such lead wires, allowing the total size of the motor mounting mechanism to be reduced.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A combination of a motor attachment device and a vibration generating type cylindrical motor to be securely mounted thereto, said cylindrical motor comprising:
    a motor frame serving as a stator, said frame having an open end and an outer generally cylindrically shaped side surface;
    a rotator disposed within said frame;
    a rotatable shaft disposed interiorly of said rotator;
    a weight eccentrically attached to said rotatable shaft for generating vibrations; and
    an electric power supply terminal provided at said open end of said frame, said motor attachment device comprising:
    a first electrode mechanically and electrically connected to said outer cylindrical side surface of said frame when said cylindrical motor is mounted in said motor attachment device, wherein said first electrode is disposed in a position radially outside of said motor frame;
    a second electrode mechanically and electrically connected to said power supply terminal when said cylindrical motor is mounted in said motor attachment device, wherein said second electrode is secured in a position axially outside of said motor frame and said electric power supply terminal; and
    a resin board on which said first and second electrodes are provided for securely fitting to said cylindrical motor, said resin board including a concave portion for receiving said cylindrical motor, wherein first electrode is a copper foil coated on a curved side wall of said concave portion, and said copper foil is electrically connected to a printed circuit board via a lead wire.

2. The combination as claimed in claim 1, wherein said resin board is formed of a polycarbonate resin material.

3. The combination as claimed in claim 1, wherein said second electrode comprises an extruded portion integrally formed with said resin board, said extruded portion including an inwardly extending free end projection having a surface coated with a copper foil which is electrically connected to said printed board via a lead wire so that, when said cylindrical motor is mounted to said motor attachment device, said power supply terminal of said cylindrical motor is engaged by said copper foil on said free end projection of said extruded portion.

4. The combination as claimed in claim 1, wherein said second electrode is formed of an elastic plate of phosphor bronze and extends vertically from said resin board, wherein a base portion of said second electrode is fixed to said resin board by ultrasonic melting and freezing fusion of the resin material forming said resin board, and wherein said second electrode is electrically connected to said printed board via a lead wire.

* * * * *